(12) United States Patent
Rostron

(10) Patent No.: US 9,442,138 B2
(45) Date of Patent: Sep. 13, 2016

(54) HIGH VOLTAGE SENSOR LOCATED WITHIN LINE INSULATOR

(71) Applicant: Southern States, LLC, Hampton, GA (US)

(72) Inventor: Joseph R. Rostron, McDonough, GA (US)

(73) Assignee: Southern States, LLC, Hampton, GA (US)

(*) Notice: Subject to any disclaimer, the term of this patent is extended or adjusted under 35 U.S.C. 154(b) by 296 days.

(21) Appl. No.: 14/451,643

(22) Filed: Aug. 5, 2014

(65) Prior Publication Data

US 2016/0041203 A1 Feb. 11, 2016

(51) Int. Cl.
*G01R 27/26* (2006.01)
*G01R 15/16* (2006.01)

(52) U.S. Cl.
CPC ..................... *G01R 15/16* (2013.01)

(58) Field of Classification Search
CPC ........ G01R 1/20; G01R 15/04; G01R 15/06; G01R 15/14; G01R 15/16; G01R 15/144; G01R 15/165; H01G 4/224
USPC .......... 324/96, 126, 658, 686, 688; 340/664; 361/1, 301.3
See application file for complete search history.

(56) References Cited

U.S. PATENT DOCUMENTS

| | | | | |
|---|---|---|---|---|
| 2001/0003424 A1* | 6/2001 | Kuperman | ............. | G01R 15/06 324/676 |
| 2006/0012382 A1* | 1/2006 | Yakymyshyn | ......... | G01R 15/06 324/705 |
| 2008/0077336 A1 | 3/2008 | Fernandes | | |
| 2011/0011623 A1 | 1/2011 | Hyde et al. | | |
| 2011/0121820 A1* | 5/2011 | Handshoe | .............. | G01R 15/16 324/126 |

FOREIGN PATENT DOCUMENTS

| | | | | |
|---|---|---|---|---|
| CH | WO 2014019692 A1 * | 2/2014 | ............... | G01R 1/18 |
| EP | 0314850 B1 | 3/1994 | | |
| EP | 2693223 A1 | 2/2014 | | |
| WO | WO8302841 A1 | 8/1983 | | |

OTHER PUBLICATIONS

PCT/US2014/051689 Inernational Search Report and Written Opinion.

* cited by examiner

*Primary Examiner* — Jeff Natalini
*Assistant Examiner* — Steven Yeninas
(74) *Attorney, Agent, or Firm* — Mehrman Law Office; Michael J. Mehrman

(57) ABSTRACT

A high voltage sensor is located within a dielectric canister inside a high voltage power line support insulator. A space through the voltage sensor accommodates a mechanical connecting rod associated with a circuit interrupter switch located in another section of the support insulator. An electrically floating dumbbell-shaped sensor extending between and capacitively coupled to high voltage and low voltage shields assumes a midpoint voltage value between the shields. A sensor plate or other suitable pickup capacitively coupled to the dumbbell sensor provides a voltage measurement, which is calibrated to provide a measurement of the power line voltage. This solution allows a voltage sensor to be added to or integrated in conventionally sized power line support insulators with no additional size, negligible additional weight, and minimal additional cost.

20 Claims, 5 Drawing Sheets

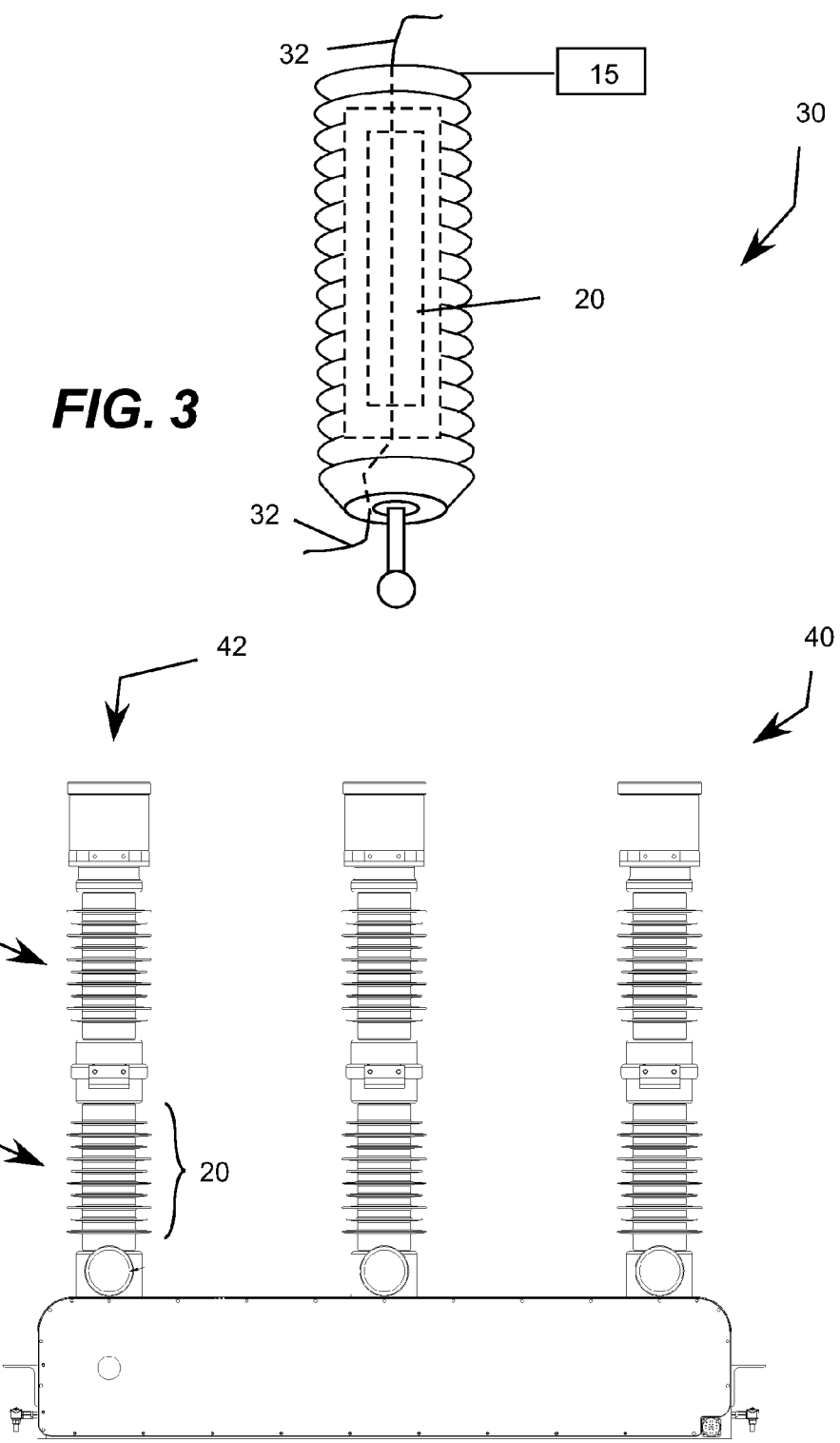

HIGH VOLTAGE SENSOR LOCATED WITHIN LINE INSULATOR

TECHNICAL FIELD

The present invention relates to voltage monitors for electric power systems and, more particularly, to a voltage sensor located within an insulator of a high voltage power line.

BACKGROUND

There is a need for voltage measurement in high voltage electric power systems for monitoring, protection, metering and other "smart grid" operations. Conventional high voltage sensors are relatively large and heavy. This makes them impractical to implement on phase-over-phase poles and other distribution circuits where weight is a critical factor. While certain types of light weight high voltage sensors are available, they are severely affected by stray capacitance caused by other structures, such as adjacent voltage sources. The sensor accuracy is further degraded by environmental contamination such as rain, crud accumulation, changes in temperature and pollution resulting in unpredictable errors that vary with weather accumulated crud conditions. These factors negatively impact the accuracy below the requirements for most applications.

Still other voltage measurement systems, such as piezoelectric transformer (PT) based technologies and other designs utilizing component housed within dielectric canisters, require the high voltage conductor carrying the line current to pass through the interior of the housing. While this minimizes environmental contamination such as crus accumulation, it also requires a relatively large diameter housing surrounding the line conductor. Alternative approaches designed to mitigate environmental factors utilize complex and expensive "pockels" type fiber optic sensors. These approaches do meet the need for light weight, small, inexpensive voltage sensors. As a result, there is continuing need for improved high voltage sensors for electric power lines.

SUMMARY

The present invention may be embodied in a voltage monitor for an electric power line located within or configured to be located within a dielectric canister inside a high voltage insulator supporting the electric power line. The voltage monitor includes a high voltage shield electrically configured for electrical connection to the electric power line and a low voltage shield electrically configured for electrical connection to electric ground. The ends of the shields within the canister are spaced apart by a sufficient distance to prevent voltage breakdown between the shields. A dumbbell-shaped floating electric sensor suspended between the shields includes an upper bell positioned adjacent to and spaced apart from the high voltage shield a sufficient distance to prevent voltage breakdown while capacitively coupling the upper bell to the high voltage shield, a lower bell positioned adjacent to and spaced apart from the low voltage shield a sufficient distance to prevent voltage breakdown while capacitively coupling the lower bell to the low voltage shield, and a sensor tube or rod physically and electrically connecting the upper bell with the lower bell. capacitive coupling between the sensor and the shields causes the floating sensor to assume a voltage between the high voltage shield and the low voltage shield. A sensor pickup obtains a sensor voltage measurement of the voltage of the floating sensor and delivers the sensor voltage measurement outside the insulator.

The sensor pickup may include a sensor plate capacitively coupled to the floating sensor. The sensor tube or rod may be a hollow sensor tube allowing a connecting rod of a circuit interrupter to pass through the sensor tube. The sensor tube may also allow a fiber optic communication cable to pass through the tube, which may also pass through the center of the connecting rod in a circuit interrupter embodiment.

The voltage monitor may also include calibration equipment that adjusts the sensor voltage measurement to indicate a voltage measurement for the power line. Communication equipment may be utilized to transmit the sensor voltage measurement and/or the voltage measurement for the power line to a remote control center. Local response equipment such as a circuit interrupter may also be operated automatically based on the sensor voltage measurement.

It will be understood that the additional techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which:

FIG. 3 is a conceptual illustration of an alternative embodiment in which the voltage detector is located inside a hanging line insulator.

FIG. 4 is a conceptual illustration of an alternative embodiment in which the voltage detector is located inside a circuit interrupter.

DETAILED DESCRIPTION

Figures 1, 2:
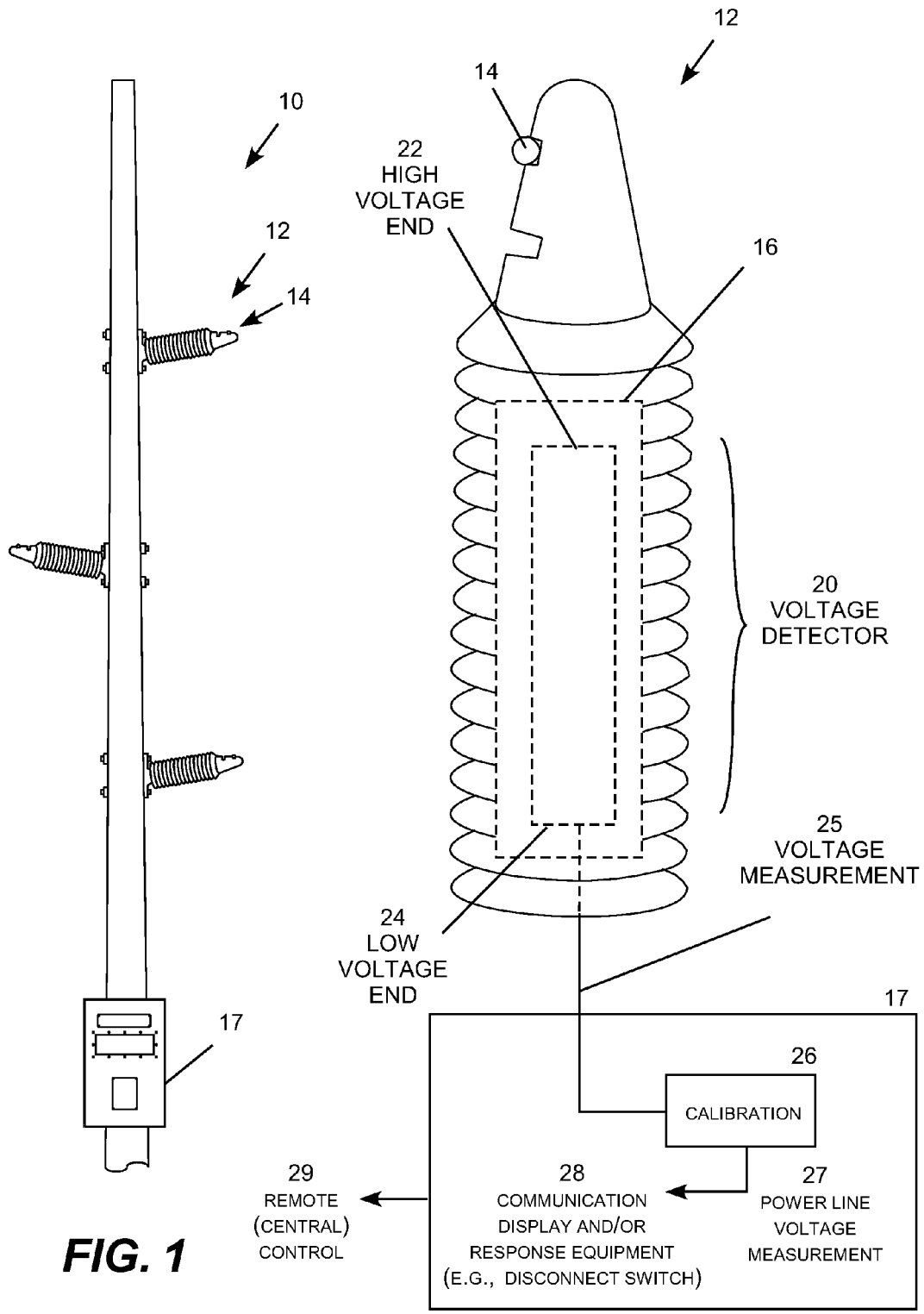
FIG. 1 is a front view of a phase-over-phase electric power pole providing an illustrative embodiment of the voltage detector located inside a line insulator.
FIG. 2 is a conceptual illustration of the voltage detector located inside a line insulator

Embodiments of the invention locate voltage sensors within a dielectric canister inside a high voltage power line support insulator. One embodiment provides space through the voltage sensor for a mechanical connecting rod associated with a circuit interrupter switch located in another section of the support insulator. An electrically floating dumbbell-shaped sensor extending between and capacitively coupled to high voltage and low voltage shields assumes a midpoint voltage value between the shields. A sensor plate or other suitable pickup capacitively coupled to the dumbbell sensor provides a voltage measurement, which is calibrated to provide a measurement of the power line voltage. This solution allows a voltage sensor to be added to or integrated in conventionally sized power line support insulators with no additional size, negligible additional weight, and minimal additional cost. As no additional space is required and the cost is low, this type of voltage sensor is suitable for transmission voltage applications as well as a wide range of lower voltage applications where conventional voltage sensors are not presently feasible, such as phase-over-phase power line poles and circuit interrupters widely used at sub-transmission and distribution voltages.

The voltage detector located inside a line insulator includes two stationary voltage shields with one shield at line voltage and the other at ground voltage. The shields are positioned to provide a sufficient gap between them within the dielectric gas inside the insulator to prevent arcing (voltage breakdown) between the shields. That is, the shields extend into the dielectric canister while supporting the voltage stress in the dielectric medium so that the integrity of the system meets the voltage requirements. An electrically floating sensor, typically shaped like a dumbbell with one bell capacitively coupled to each shield and a conductive shaft connecting the bells, extends between the shields. The two large bells are spaced apart from the shields to provide significant capacitance between the bells and the shields to cause the sensor naturally float at the midpoint voltage between the high voltage shield and the grounded shield. These large bells are connected with a relatively small diameter conductive tube that mechanically and electrically connects the bells together. For a circuit interrupter embodiment, the tube has a sufficient diameter to allow the mechanical connecting rod of the interrupter to pass through the center of the connecting tube, which eliminates the need for a separate insulator to house the voltage detector.

The relatively small diameter connecting tube and the positioning of the electric shields relatively close together while still preventing voltage breakdown minimizes the exposed area of this floating sensor to stray voltage. In other words, shields electrically shield the bells from stray voltage, exposing only the relatively small length of the relatively small connection tube external electric fields. This significantly reduces stray capacitive effects between the sensor and other grounded structures or outside voltage sources. Locating the voltage detector inside the dielectric canister of the insulator allows the gap between the shields to be minimized while virtually eliminate environmental effects like rain, pollution, and accumulated crud. Is should be noted that any variation in the voltage gradient within ambient air along the outside surface of the insulator will not affect the driving voltage division between the shields caused by the floating sensor inside the dielectric canister of the insulator. The term "floating" in this sense means that the sensor is suspended within the dielectric gas causing the sensor to be capacitively coupled to the shields rather than being in direct electrical contact (shorted) to either shield, which are maintained at ground and line voltage, respectively.

A sensor plate or other suitable pickup is located adjacent to but spaced apart from the dumbbell-shaped sensor a sufficient distance to be capacitively coupled to the sensor. A wire from the sensor plate provides a sensor output signal that is calibrated to indicate the line voltage. This system is an improvement in that it uses an existing insulator as the housing for the voltage detector. A dielectric insulation system, which already exists for the circuit interrupter alternative, provides for a mechanical connecting rod to pass through the sensor system. The arrangement of the dumbbell shaped floating sensor allows for the signal to be detected without being affected significantly by outside contamination effects that are intrinsic in all voltage measurement systems and hence require either significant error tolerance or very large capacitances between the high voltage and ground of the voltage to be measured.

FIG. 1 is a front view of a phase-over-phase electric power pole 10 providing an illustrative embodiment of the voltage detector located inside a line insulator. The power pole 10 includes three line insulators that each support a phase conductor. The insulator 12 supporting the phase conductor 14 includes an internal voltage detector in this example. While each phase may include a voltage detector, one voltage detector along with current monitors for each phase is typically sufficient for power line monitoring.

FIG. 2 is a conceptual Illustration of the voltage detector 20 located inside the line insulator 12. The line insulator 12 includes an internal sealed canister 16 filled with a dielectric medium gas, such as the dielectric $SF_6$ or another suitable dielectric gas utilized in the electric power industry. Although a dielectric gas is most commonly used, a dielectric foam or liquid could also be utilized. The dielectric canister 16 houses an electrically floating voltage sensor 20 that is capacitively coupled to both the high voltage end 22 and the low voltage end 24 of the canister 16. This allows the floating voltage sensor 20 to serve as a voltage divider assuming a midpoint voltage between the high voltage end 22 (at line voltage) and the low voltage end 24 (at ground voltage). A signal line that is capacitively coupled to the floating voltage sensor 20 provides a voltage measurement 25 indicative of the voltage of the floating voltage sensor, which is calibrated to provide an indication of the voltage of the line voltage.

The sensor voltage measurement 25 may be connected to hardware or software calibration equipment 26 that may be adjusted to produce a power line voltage measurement 28 based on the sensor voltage measurement 25. Sensor calibration is very well known in the power industry and any suitable type of calibration may be utilized. For example, an analog-to-digital converter and associated op-amp circuitry with a variable resistor may be used to generate a calibrated output signal based on the sensor measurement value. The voltage measurement 25 and/or the power line voltage measurement 28 may then passed to communication, display and/or control equipment 28 for displaying or operating elements of the power system based on the voltage measurement. Referring again to FIG. 1, for example, the calibration equipment 26 may be located in a local control box 17, which may also contain local response equipment 28, such as communication equipment for transmitting the voltage measurement to a remote control center 29 that receives a large number of power line measurements for coordinated power system operation. The local response equipment 28 may also include a line disconnect switch and associated actuator that automatically operates in response to a rapid voltage drop and associated current surge characteristic of a line fault. For example, the control box 17 may automatically disconnect and reconnect a faulted line a predefined number of times to allow a passing fault, such as tree limb temporarily faulting the line, to clear naturally before maintaining the disconnection and dispatching a repair crew. Alternatively or additionally, the local response equipment 28 may operate in response to commands from the remote control center 29.

FIG. 3 is a conceptual illustration of an alternative embodiment in which the voltage detector 20 is located inside a hanging line insulator 30, which is often used on high voltage transmission lines. Although automatic switching equipment may be connected to the voltage detector, in this line-mounted embodiment the associated equipment (referred to generally as "response equipment") is typically limited to a calibration and communication unit 15. As an option, a fiber optic cable 32 may also be routed through the voltage sensor.

FIG. 4 is a conceptual illustration of another alternative embodiment in which the voltage detector is located inside a circuit interrupter 40. A phase interrupter 42 includes two insulators 44 and 46 that each house internal dielectric canisters. The upper canister 44 contains the interrupter mechanism, while the lower canister 46 contains the voltage detector 20 which is configured to accommodate the connecting rod driven by the actuator mechanism 48 that drives the interrupter mechanism. The voltage detector located within the lower insulator 46 is configured to accommodate and occupy the same dielectric canister as the connecting rod.

Figure 5:
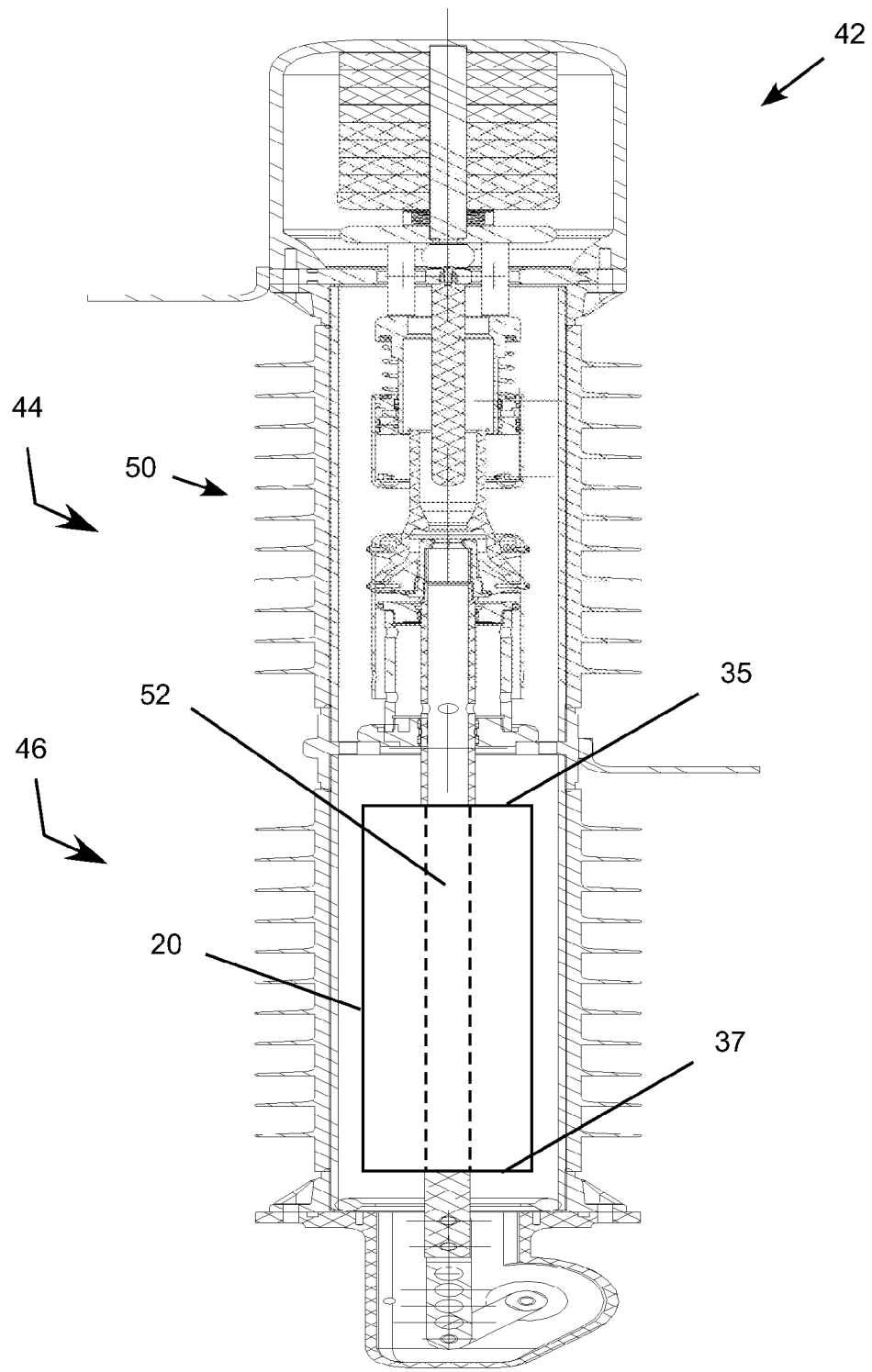
FIG. 5 is a sectional view showing the internal location of the voltage detector located within a circuit interrupter.

FIG. 5 is a sectional view of the circuit interrupter 42 showing the internal location of the voltage detector located 20 within the circuit interrupter. The upper insulator 44 houses the interrupter mechanism 50, while the lower insulator 46 houses the connecting rod 52. As noted above, the voltage detector 20 located within the lower insulator 46 is configured to accommodate and occupy the same dielectric canister as the connecting rod 52. While this configuration is adapted for a circuit interrupter, the same sensor structure may be used for alternative embodiments that do not have to accommodate a connection rod, although the connecting rod may be smaller in diameter and/or solid in these other embodiments.

Figure 6:
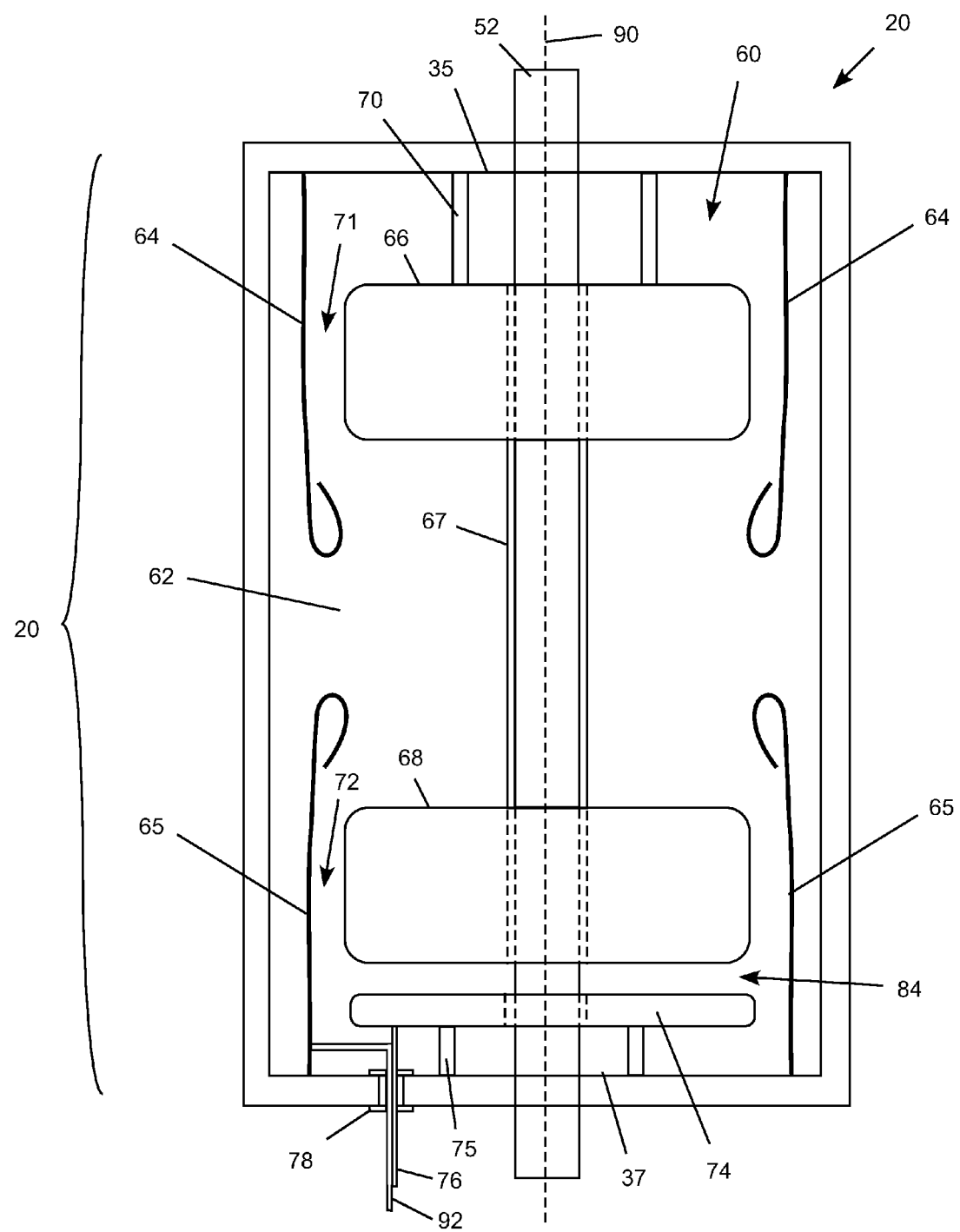
FIG. 6 is a sectional view showing the configuration of the voltage detector located inside a circuit interrupter.

FIG. 6 is a sectional view showing the configuration of the voltage detector 20 located inside the circuit interrupter accommodating the connecting rod 52 passing through the center of the voltage detector. The voltage detector 20 includes a floating sensor 60 located within a dielectric canister filled with a dielectric gas 62. The canister extends from a high voltage end 35 maintained at line voltage to a low voltage end 37 maintained at ground voltage. A hollow, cylindrical high voltage shield 64 maintained at line voltage extends from the high voltage end 35 into the canister, while a low voltage shield 65 maintained at ground voltage extends from the low voltage end 37 into the canister. The electrically floating sensor 60 is dumbbell shaped with opposing upper and lower bells 66, 68 separated by a hollow tube 67 sized to receive the connecting rod 52. The sensor 60 may be hollow, thin and light constructed from a conductive material, such as sheet steel or aluminum. The shields 64, 66 may likewise be thin and light constructed from a conductive material, such as sheet steel or aluminum with a rolled edge within the canister to reduce the voltage stress.

The sensor 60 is suspended from an insulator support 70 (typically a concentric cylindrical section) to position the sensor in the center of the dielectric canister midway between the high voltage end 35 and the low voltage end 37. The upper bell 66 is positioned with a gap 71 between the upper bell and the high voltage shield 64 sufficient to prevent voltage breakdown across the gap while capacitively coupling the upper bell 66 to the high voltage shield 64. Similarly, lower bell 68 is positioned with a gap 72 between the lower bell and the low voltage shield 65 sufficient to prevent voltage breakdown across the gap while capacitively coupling the lower bell 68 to the low voltage shield 65. A sensor plate 74 is positioned by an insulator support 75 (typically a concentric cylindrical section) adjacent to the lower bell 68. A gap 84 between the sensor plate 74 and the lower bell 68 prevent voltage breakdown across the gap while capacitively coupling the sensor plate 74 to the lower bell 68. A signal line 76 extends from the sensor plate 74 through a seal 78 in the dielectric canister to deliver the voltage measurement outside the insulator, where it calibrated and connected to communication and control equipment. As an option, a second signal line 92 connected to the adjacent shield 65 may also be provided as a component of the voltage measurement signal. In situations where the shield is grounded, however, a separate signal line for the reference voltage is not necessary. As another option, a fiber optic cable 90 may be routed through the voltage sensor, for example through the center of a hollow connecting rod 52.

Figure 7:
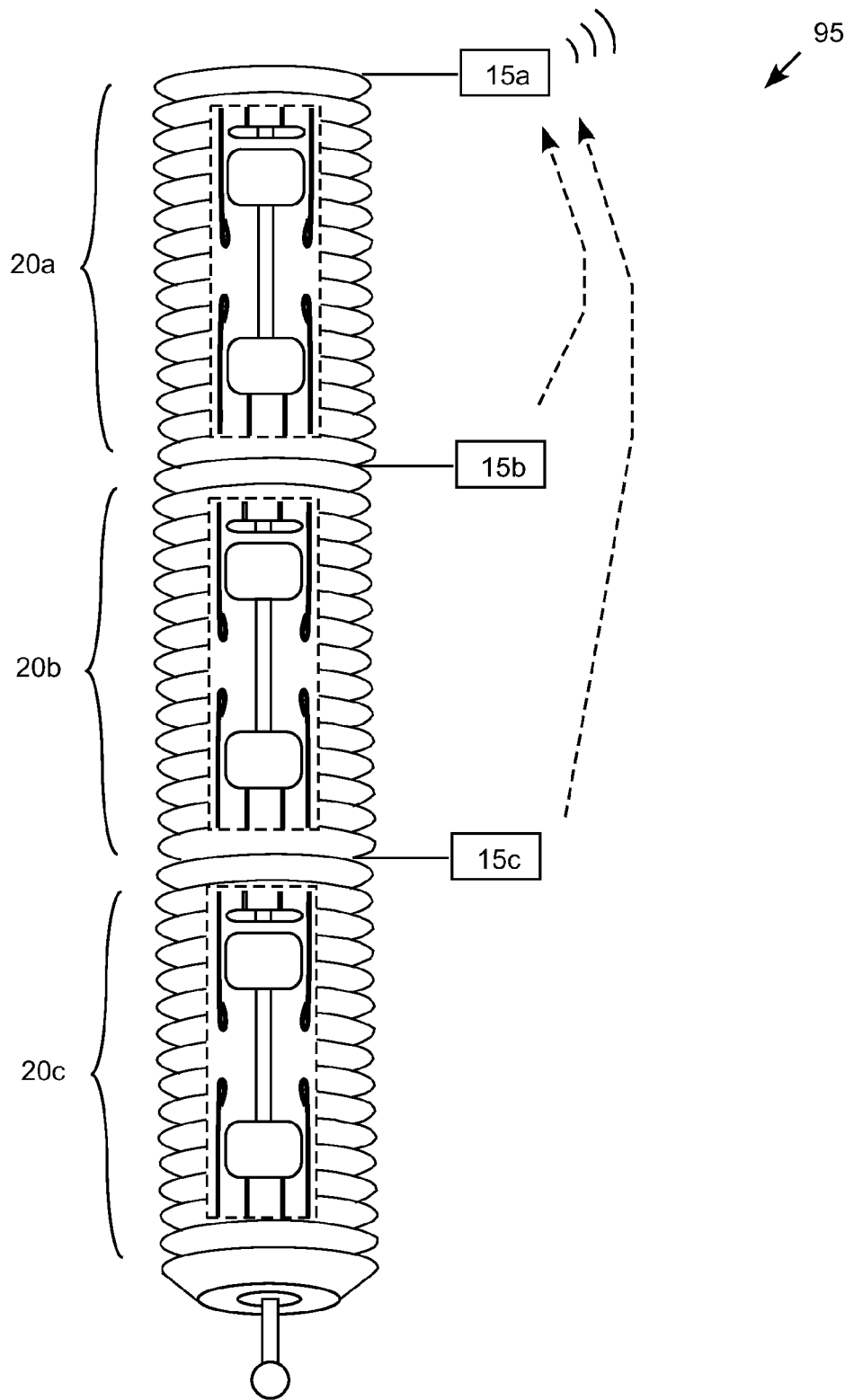
FIG. 7 is a conceptual illustration of an extra high voltage power line insulator containing three cascaded voltage detectors within the line power insulator.

FIG. 7 is a conceptual illustration of an extra high voltage power line insulator 95 containing three cascaded voltage detectors within the line power insulator. As described above, with reference to FIG. 6, a second signal line 92 connected to the adjacent shield 65 may also be provided as a component of the voltage measurement signal. While this option is not usually necessary in an embodiment with a single voltage detection where the low voltage shield is grounded, it is utilized in the cascaded embodiment shown in FIG. 7. This approach is suitable for extra high voltage applications (e.g., 240 kV, 345 kV, 500 kV and 750 kV utilized in some parts of the U.S. and comparable voltages utilized elsewhere) in which the power line insulators as sufficiently long to render a single floating voltage detector unwieldy. To illustrate this situation for the insulator 95, multiple voltage detectors 20*a*-*c* are cascaded within the insulator. Each detector is typically located within a separate dielectric canister within a separable section of the insulator. This produces a modular design in which the shield one end of the cascade is connected to line voltage, the shield on the opposing end of the cascade is connected to ground, and the intervening shields are floating. An additional signal line measuring the reference voltage of a floating shield is therefore utilized for the intervening shields. Each section also includes its own calibration and communication unit 15*a*-15*c* with one of the units receiving the voltage signals from the other detectors, assembling and communicating a package for the overall voltage detector 95. With this approach, it becomes cost effective to include voltage detectors for each phase of as many high voltage towers as desired, which aids a wide range of "smart grid" operations and fault isolation techniques.

The voltage detection techniques employed by the invention are indifferent to the specific type of current monitoring equipment, communication equipment, and response equipment utilized in conjunction with the voltage detectors. The voltage detection techniques may therefore be employed with any suitable of current sensors, data transmitters, analysis techniques and response equipment. Regardless of these specifics, the invention provides for a more robust system of distributed power monitoring stations where power line monitoring is feasible throughout the power grid from the highest backbone transmission voltages down to distribution voltages. This type of complete grid monitoring is a critical feature of an overall smart grid system.

To provide some illustrative examples of the technologies that may be combined with the voltage detectors into a larger smart grid system in accordance with the invention, an example of a compact power line current sensor for a circuit interrupter is described in commonly owned U.S. application Ser. No. 14/104,932 (U.S. Pub. No. 2014-0160612); which is incorporated by reference. Example circuit switchers and associated response equipment are described in commonly-owned U.S. Pat. Nos. 6,236,010; 6,316,742; 6,483,679; 6,583,978; 7,078,643; 7,115,828; 7,745,753; 8,063,333; 8,274,007; 8,541,702; and commonly-owned U.S. application Ser. Nos. 14/104,875; 14/050,476, which are also incorporated by reference. This application further incorporates by reference the disclosures of commonly-owned U.S. Pat. Nos. 6,750,563; 7,192,074; 7,476,823; 7,683,798; 8,392,130; and commonly-owned U.S. application Ser. Nos. 13/229,808; 13/229,095; 13/217,318; and Ser. No. 13/864,611, which provide some examples of power line monitoring, analysis and fault isolation response techniques. Although these examples of representative the types of technologies in the smart grid system according to the invention, those skilled in the art will understand that other types of components can be integrated into the system in accordance with the teachings of the invention.

In view of the foregoing, it will be appreciated that present invention provides significant improvements in voltage detectors for high voltage power lines. The foregoing relates only to the exemplary embodiments of the present invention, and that numerous changes may be made therein without departing from the spirit and scope of the invention as defined by the following claims.

The invention claimed is:

1. A voltage monitor for an electric power line configured for positioning within a dielectric canister within a high voltage insulator supporting the electric power line, comprising:
   a high voltage shield electrically configured for electrical connection to the electric power line;
   a low voltage shield electrically configured for electrical connection to electric ground;
   wherein the high voltage shield and the low voltage shield are positioned within the canister and spaced apart by a sufficient distance to prevent voltage breakdown between the shields;
   a dumbbell-shaped floating electric sensor configured for suspension between the shields comprising:
      an upper bell positioned adjacent to and spaced apart from the high voltage shield a sufficient distance to prevent voltage breakdown while capacitively coupling the upper bell to the high voltage shield,
      a lower bell positioned adjacent to and spaced apart from the low voltage shield a sufficient distance to prevent voltage breakdown while capacitively coupling the lower bell to the low voltage shield, and
      a sensor tube or rod physically and electrically connecting the upper bell with the lower bell;
   wherein the dumbbell-shaped floating electric sensor is configured a voltage between the high voltage shield and the low voltage shield due to the capacitive coupling between the sensor and the shields;
   a sensor pickup configured to obtain a sensor voltage measurement of the voltage of the floating sensor and deliver the sensor voltage measurement outside the insulator.

2. The voltage monitor of claim 1, wherein the sensor pickup comprises a sensor plate capacitively coupled to the floating sensor.

3. The voltage monitor of claim 1, wherein the sensor tube or rod is a hollow sensor tube configured to allow passage of a connecting rod of a circuit interrupter through the sensor tube.

4. The voltage monitor of claim 1, wherein the sensor tube or rod is a hollow sensor tube configured to allow passage of a fiber optic communication cable through the sensor tube.

5. The voltage monitor of claim 1, wherein the sensor tube or rod is a hollow sensor tube configured to allow passage of a connecting rod of a circuit interrupter through the sensor tube, and the connecting rod is hollow to allow passage of a fiber optic communication cable through the connecting rod.

6. The voltage monitor of claim 1, further comprising calibration equipment configured to adjust the sensor voltage measurement to indicate a voltage measurement for the power line.

7. The voltage monitor of claim 1, further comprising communication equipment for transmitting the sensor voltage measurement and/or the voltage measurement for the power line to a remote control center.

8. The voltage monitor of claim 1, further comprising response equipment for automatically operating a circuit interrupter based directly or indirectly on the sensor voltage measurement.

9. An insulator for an electric power line comprising a dielectric canister inside the insulator filled with a dielectric gas and a voltage sensor located within the dielectric canister, comprising:
   a high voltage shield electrically configured for electrical connection to the electric power line;
   a low voltage shield electrically configured for electrical connection to electric ground;
   wherein the high voltage shield and the low voltage shield are positioned within the canister and spaced apart by a sufficient distance to prevent voltage breakdown between the shields;
   a dumbbell-shaped floating electric sensor configured for suspension between the shields comprising:
      an upper bell positioned adjacent to and spaced apart from the high voltage shield a sufficient distance to prevent voltage breakdown while capacitively coupling the upper bell to the high voltage shield,
      a lower bell positioned adjacent to and spaced apart from the low voltage shield a sufficient distance to prevent voltage breakdown while capacitively coupling the lower bell to the low voltage shield, and
      a sensor tube or rod physically and electrically connecting the upper bell with the lower bell;
   wherein the floating sensor configured to assume a voltage between the high voltage shield and the low voltage shield due to the capacitive coupling between the sensor and the shields;
   a sensor plate capacitively coupled to the dumbbell-shaped floating electric sensor configured to obtain a sensor voltage measurement of the voltage of the floating sensor and deliver the sensor voltage measurement outside the canister.

10. The insulator of claim 9 configured to support a fiber optic cable extending through the voltage sensor.

11. The insulator of claim 9 configured to support an electric power phase conductor in a phase-over-phase power line configuration.

12. The insulator of claim 9 configured to support an electric power phase conductor in a hanging power line configuration.

13. The insulator of claim 9 configured as part of a circuit interrupter.

14. The insulator of claim 9, wherein the circuit interrupter of claim 13 further comprising a connecting rod extending through the voltage sensor.

15. The insulator of claim 9, further comprising communication equipment for transmitting the sensor voltage measurement and/or the voltage measurement for the power line to a remote control center.

16. The insulator of claim 9, further comprising response equipment for automatically operating a circuit interrupter based directly or indirectly on the sensor voltage measurement.

17. A voltage monitor for an electric power line comprising a voltage sensor located within a dielectric canister filled with a dielectric gas, the voltage sensor comprising:
- means for providing a high voltage shield electrically configured to the electric power line inside the canister;
- means for providing a low voltage shield electrically configured to electric ground inside the canister;
- floating sensor means for capacitively coupling to the high voltage shield and the low voltage shield to assume a voltage between the high voltage shield and the low voltage shield due to the capacitive coupling;
- means for detecting a sensor voltage measurement of the floating sensor means and delivering the sensor voltage measurement outside the canister.

18. The voltage monitor of claim 17, further comprising means for calibrating the sensor voltage measurement.

19. The voltage monitor of claim 17, further comprising means for communicating the sensor voltage measurement or a calibrated value based on the sensor voltage measurement.

20. The voltage monitor of claim 17, further comprising means for responding to the sensor voltage measurement.

\* \* \* \* \*